United States Patent [19]

Thompson

[11] 4,343,827
[45] Aug. 10, 1982

[54] METHOD OF FINE-TUNING A MONOLITHIC CRYSTAL FILTER

[75] Inventor: Edwin C. Thompson, West Epping, N.H.

[73] Assignee: Western Electric Company, Inc., New York, N.Y.

[21] Appl. No.: 223,528

[22] Filed: Jan. 8, 1981

[51] Int. Cl.³ .................. H01P 11/00; H03H 3/02
[52] U.S. Cl. .................. 427/8; 29/25.35; 427/10; 427/100
[58] Field of Search ............ 427/8, 10, 100; 29/25.35

[56] References Cited

U.S. PATENT DOCUMENTS

| | | | |
|---|---|---|---|
| 3,549,414 | 12/1970 | Curran et al. | 427/100 |
| 3,585,418 | 6/1971 | Koneval | 333/72 |
| 4,112,147 | 9/1978 | Thompson | 427/100 |

*Primary Examiner*—John D. Smith

*Attorney, Agent, or Firm*—D. D. Bosben

[57] ABSTRACT

A method of fine-tuning a monolithic crystal filter (11) having a solid electrode (16) on one side of a crystal wafer (13) and a pair of split electrodes (12-1 and 12-2) on an opposite side of the wafer, to define a pair of resonators (19 and 21), involves short-circuiting one of the split electrodes to the solid electrode to produce a filter resonator coupling frequency wave form having first and second peaks ($P_A$ and $P_B$), the positions of which correspond to upper and lower short circuit resonator resonant frequencies ($F_A$ and $F_B$), respectively, of the filter. Additional electrode material then is plated on one or the other half of the solid electrode (16) to balance the wave form peaks ($P_A$ and $P_B$), thus balancing the open circuit resonator resonant frequencies of the filter (11). Additional electrode material then is plated on the entire solid electrode to fine-tune the midband frequency ($F_M$) of the filter (11) to a final desired value ($F_{MF}$).

5 Claims, 10 Drawing Figures

METHOD OF FINE-TUNING A MONOLITHIC CRYSTAL FILTER

TECHNICAL FIELD

This invention relates to a method of fine-tuning a monolithic crystal filter, and more particularly to a method of finetuning a monolithic crystal filter by plating a selected portion of an electrode of the filter to correct an open circuit resonator frequency unbalance of the filter prior to plating the electrode to obtain a desired final filter midband frequency.

BACKGROUND OF THE INVENTION

The E. C. Thompson U.S. Pat. No. 4,112,147 discloses a method of manufacturing a monolithic crystal filter having a solid electrode on one side of a crystal wafer, and a pair of split electrodes on an opposite side of the wafer, to define a pair of resonators. In that patent the electrodes are formed in a base plating operation to produce a filter having an initial resonator coupling frequency which is wider or greater than a final desired resonator coupling frequency and which has an initial midband frequency greater than a final desired midband frequency. The filter then is mounted in a vapor deposition apparatus and additional electrode material is uniformly plated on the pair of split electrodes to decrease or narrow the resonator coupling frequency to a value which is essentially equal to the final desired resonator coupling frequency. The filter next is inverted in the vapor deposition apparatus and additional electrode material is uniformly plated on the solid electrode to establish the midband frequency of the filter at a value slightly above the final value desired. When the electrodes are plated in this sequence, the resonator coupling frequency decreases substantially during the additional plating of the split electrodes, but remains essentially constant, within tolerance limits, during the plating of the solid electrode, whereby further adjustment of the resonator coupling frequency is not necessary.

After the monolithic crystal filter has been formed in the E. C. Thompson U.S. Pat. No. 4,112,147 as above-described, the filter is attached or "floated" to a metal header with the split electrodes facing outward. The filter then is fine-tuned to the desired final midband frequency by plating additional electrode material onto the split electrodes to balance the resonators at the final midband frequency. This procedure is disadvantageous since the additional plating on the split electrodes further reduces the resonator coupling frequency of the filter, sometimes to the point where the value of the resonator coupling frequency falls outside tolerance limits. The filter then must be subjected to additional processing, or may have to be discarded.

Accordingly, a primary purpose of this invention is to provide a new and improved method of fine-tuning a monolithic crystal filter without causing any significant change in the resonator coupling frequency of the filter.

SUMMARY OF THE INVENTION

In general, a method of fine-tuning a monolithic crystal filter having a solid electrode on one side of a crystal wafer and a pair of split electrodes on an opposite side of the wafer, to define a pair of resonators, includes the steps of plating additional electrode material on a selected portion of the solid electrode to balance the open circuit resonator resonant frequencies of the filter. Additional electrode material then is plated on substantially the entire solid electrode to adjust the filter to a desired midband frequency.

More specifically, one of the split electrodes initially is short-circuited to the solid electrode to produce a filter resonator coupling frequency wave form having first and second peaks, the positions of which correspond to upper and lower short circuit resonator resonant frequencies of the filter, respectively. The resonator coupling frequency wave form then is displayed on a screen and the open circuit resonator resonant frequencies of the filter are balanced by plating additional electrode material on substantially an entire portion of the solid electrode which, in conjunction with an associated one of the split electrodes, defines the resonator having the peak of least magnitude and thus the highest open circuit resonant frequency, until the magnitudes of the peaks of the wave form are balanced. Additional electrode material then is plated on substantially the entire solid electrode to adjust the filter to a desired midband frequency.

DETAILED DESCRIPTION

Figure 1:
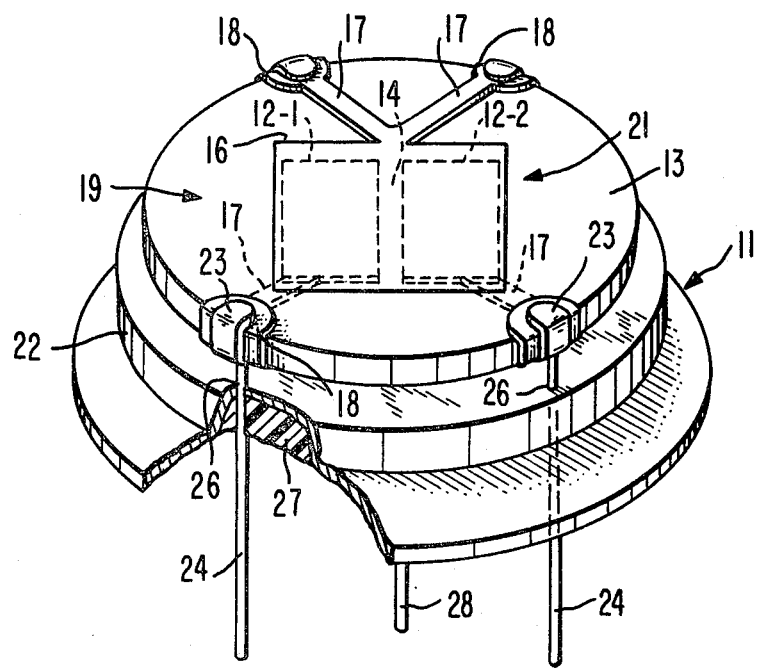
FIG. 1 is an isometric view of a monolithic crystal filter which may be fine-tuned in accordance with this invention.

Referring to FIG. 1, a monolithic crystal filter 11 of a known type which may be fabricated as disclosed in E. C. Thompson U.S. Pat. No. 4,112,147 and then fine-tuned in accordance with the disclosed embodiment of the invention, has a pair of first and second split electrodes (e.g., gold) 12-1 and 12-2 vapor deposited or otherwise plated on one side (bottom in FIG. 1) of a circular AT-cut quartz crystal body or wafer 13 so as to be separated by a narrow gap 14 therebetween. A solid electrode 16 is similarly vapor deposited or otherwise plated on an opposite side (top in FIG. 1) of the crystal wafer 13 so that the split electrodes 12 and the solid electrode are in superimposed relationship. Leads 17 of each of the electrodes 12 and 16 are plated on its associated side of the circular crystal wafer 13 and extend to the peripheral edge of the wafer where they merge into terminals 18 which extend around an adjacent edge portion of the crystal wafer 13 to the opposite side of the wafer. The pair of split electrodes 12-1 and 12-2 and respective portions of the solid electrode 16 form two resonators 19 and 21 with the crystal wafer 13.

The monolithic crystal filter 11 is attached or "floated" on a cylindrical cap-shaped metal header 22 with the solid electrode 16 facing outwardly (upward in FIG. 1), by being fixedly mounted on upper ends of four ribbon support leads 23 crimped about and secured to the terminals 18 of the electrode leads 17 by an epoxy cement. The ribbon support leads 23 have lower ends suitably bonded to upper ends of stiff wire leads 24 which extend through apertures 26 in the metal header 22, with portions of the wire leads being embedded in a glass insulating material 27 in the header. A wire ground lead 28 also is secured to and extends from the metal header 22.

Figure 2:
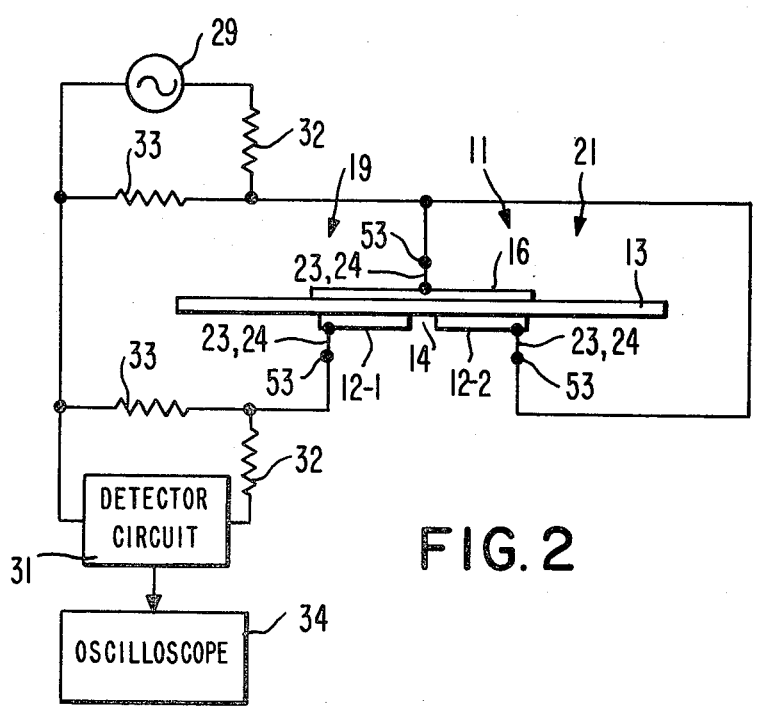
FIG. 2 is a schematic representation of a circuit for determining open circuit resonant frequency unbalance of the monolithic crystal filter shown in FIG. 1.

Referring to FIG. 2, a circuit of a known type for determining open circuit resonant frequency unbalance of the monolithic crystal filter 11 shown in FIG. 1 includes a high frequency generator 29, a detector circuit 31, a pair of series resistors 32, a pair of shunt resistors 33 and an oscilloscope 34. The frequency generator 29, the detector circuit 31 and the resistors 33 are connected in series with one of the split electrodes 12 (e.g., 12-1), the solid electrode 16 and the intervening portion of the crystal wafer 13. The other split electrode (e.g., 12-2) is short-circuited to the solid electrode 16.

Figure 3:
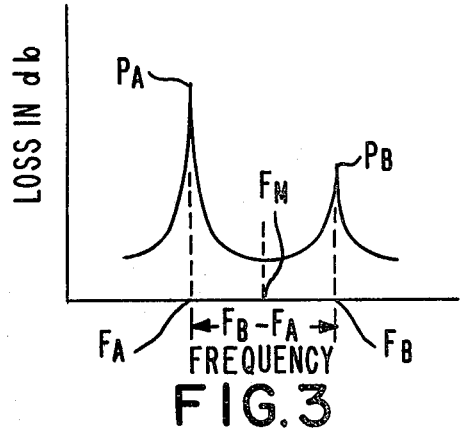
FIG. 3 is a graph illustrating a first possible transmission characteristic curve of a monolithic crystal filter as shown in FIG. 1, which can be obtained with the circuit of FIG. 2.
Figure 4:
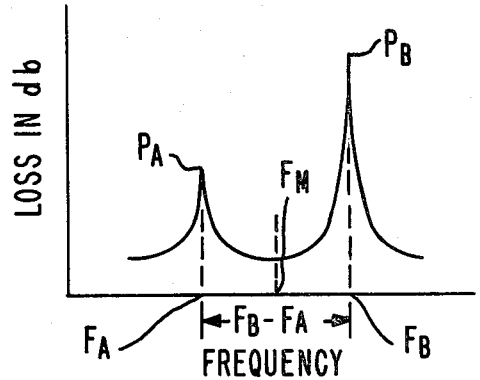
FIG. 4 is a graph illustrating a second possible transmission characteristic curve of a monolithic crystal filter as shown in FIG. 1, which can be obtained with the circuit of FIG. 2.
Figure 5:
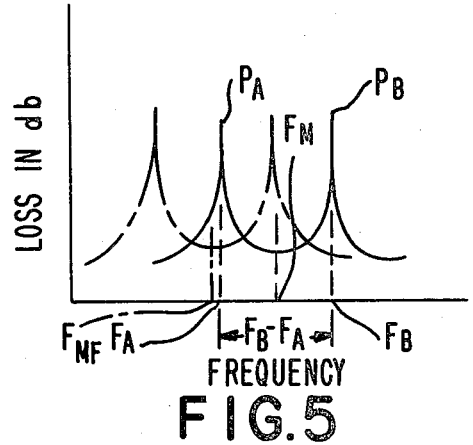
FIG. 5 is a graph illustrating a third possible transmission characteristic curve of a monolithic crystal filter as shown in FIG. 1, which can be obtained with the circuit of FIG. 2.
Figure 8:
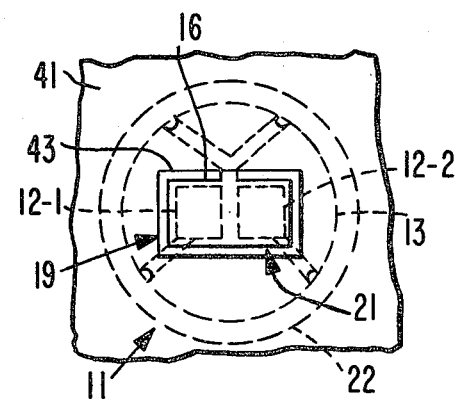
FIG. 8 is a schematic view illustrating another method step for fine-tuning a monolithic crystal filter as shown in FIG. 1.

When the frequency generator 29 applies a drive voltage to the first electrode 12-1, a resultant wave form, which may take a shape as illustrated in either of the FIG. 3, 4 or 5, is displayed on the oscilloscope 34. More specifically, horizontal positions of first and second peaks of the wave form designated $P_A$ and $P_B$, respectively, represent the short circuit resonant frequencies $F_A$ and $F_B$ of the resonators 19 and 21, respectively. The horizontal distance between these two frequencies, $F_B$-$F_A$, is equal to the filter resonator coupling. The value of frequency located centrally between $F_B$ and $F_A$ and designated $F_M$, which is essentially equal to ($F_B$+$F_A$/2), represents the filter midband or center frequency of the filter 11. When the peaks $P_A$ and $P_B$ are of the same magnitude as illustrated in FIG. 5, the open circuit resonator resonant frequencies are balanced and the midband frequency $F_M$ of the filter 11, illustrated in solid lines in FIG. 5, may be fine-tuned directly to a desired final value $F_{MF}$, illustrated in broken lines in FIG. 5, in a manner as illustrated in FIG. 8 and described hereinafter.

When the peaks $P_A$ and $P_B$ of the wave form are unbalanced, with the peak $P_B$ on the right-hand side of the wave form, as shown in FIG. 3, of reduced magnitude with respect to the peak $P_A$ on the lefthand side of the wave form in that figure, the open circuit resonant frequency of the resonator 21 has a greater value than the open circuit resonant frequency of the resonator 19. Further, the filter resonator coupling $F_B$-$F_A$ is slightly greater than a final desired value as shown in FIG. 5, when the open circuit resonant frequencies are balanced. In accordance with this invention, referring to FIG. 6, the left-hand half of the solid electrode 16 then is masked by a shield 41 and additional electrode material is vapor deposited on the right-hand half of the solid electrode through a window 42 in the shield until the peaks $P_A$ and $P_B$ are of equal magnitude as shown in FIG. 5, to balance the open circuit resonant frequencies of the filter 11. At the same time, the filter resonator coupling $F_B$-$F_A$ narrows to the final desired value, as illustrated in FIG. 5.

Figure 7:
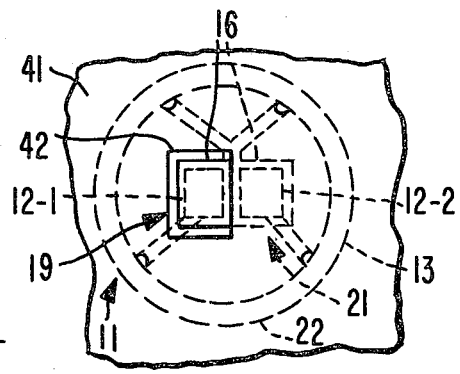
FIG. 7 is a schematic view similar to FIG. 6, illustrating a method step for fine-tuning a monolithic crystal filter having the transmission characteristic curve shown in FIG. 4.

Similarly, when the peak $P_A$ on the left-hand side of the wave form is of reduced magnitude with respect to the peak $P_B$, as shown in FIG. 4, indicating that the resonator 19 has a greater open circuit resonant frequency than the resonator 21, the right-hand half of the solid electrode 16 as viewed in FIG. 7 is masked by the shield 41. Additional electrode material then is vapor deposited on the left-hand half of the solid electrode through the window 42 until the peaks $P_A$ and $P_B$ are of equal magnitude as shown in FIG. 5, to balance the open circuit resonant frequencies of the filter 11 and narrow the filter resonator coupling $F_B$-$F_A$ to the final desired value. After the open circuit resonant frequencies of the filter 11 have been balanced in this manner, additional electrode material is deposited on the entire surface of the solid electrode 16 through another window 43 in the shield 41, as illustrated in FIG. 8, to fine turn (reduce) the midband frequency $F_M$ of the filter to the final desired value $F_{MF}$ as illustrated by the wave form shown in broken lines in FIG. 5.

Figure 9:
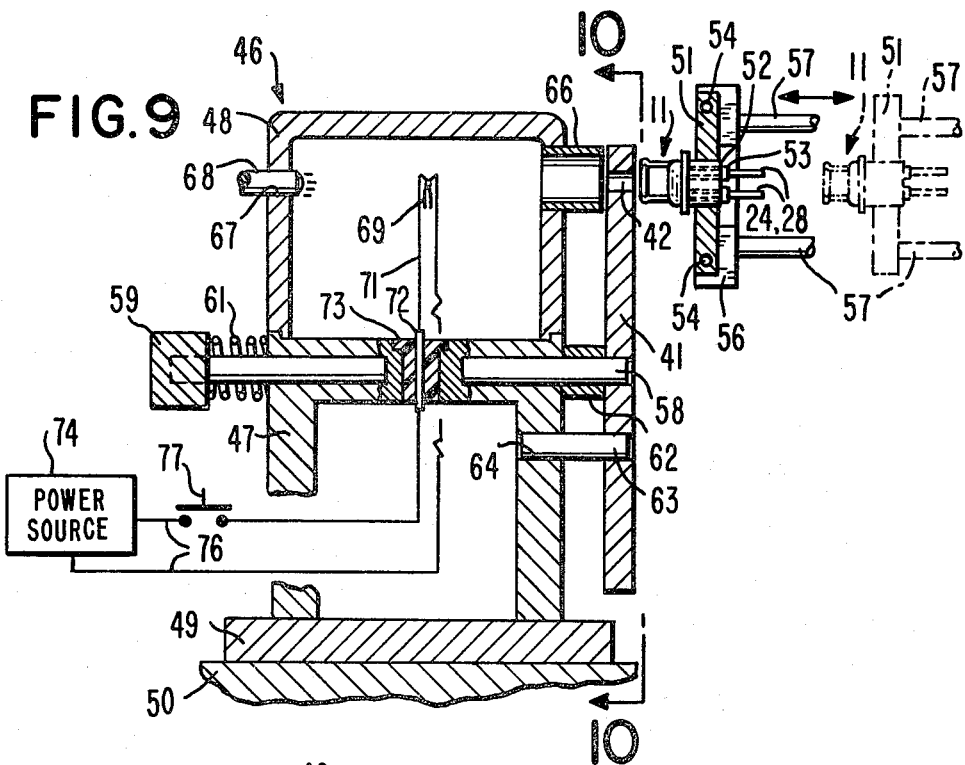
FIG. 9 is a cross-sectional view of an apparatus for practicing the invention.
Figure 10:
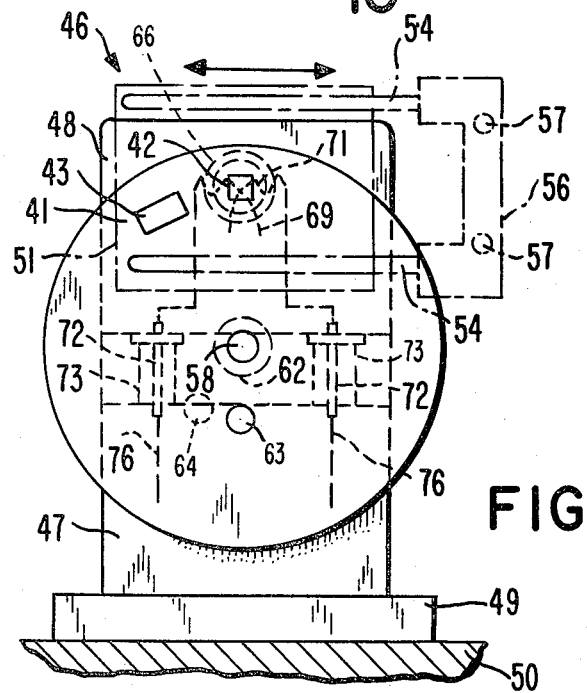
FIG. 10 is an elevational view of the apparatus shown in FIG. 9, as viewed along the line 10—10 in FIG. 9.

FIGS. 9 and 10 illustrate an apparatus 46 which may be utilized for practicing the invention as above described. The apparatus 46 includes an inverted U-shaped generally cylindrical support block 47 upon which an inverted cup-shaped cylindrical deposition chamber 48 rests by gravity so as to permit ready removal of the deposition chamber from the support block. A lower end of the support block 47 is secured to a base plate 49 by suitable screws (not shown). The base plate 49 is suitably secured, such as by clamps (not shown), to a support plate 50 of a bell jar-type vacuum device, the details of which are not shown.

The apparatus 46 of FIGS. 9 and 10 further includes a rectangular monolithic crystal filter support slide 51 having a cylindrical lead-receiving and electrically insulating plastic socket 52 (shown only in FIG. 9) press-fitted into an aperture in the support slide. The plastic socket 52 has electrical terminals 53 mounted therein for receiving the leads 24 and 28 of the monolithic crystal filter 11, to connect the filter electrically into the circuit shown in FIG. 2.

The filter support slide 51 is mounted for horizontal sliding movement in a "Y" direction (into and out of the paper in FIG. 9) on a first set of upper and lower guide rods 54 mounted in cantilever fashion at their right-hand ends, as viewed in FIG. 10, on a support bracket 56, for manual positioning of the filter in the "Y" direction. Further, the support bracket 56 is mounted for manual horizontal movement in an "X" direction between a retracted position as shown in broken lines in FIG. 9, for inserting and removing the filter 11 from the plastic socket 52, and an advanced position as shown in solid lines in FIG. 9, for a vapor deposition operation. For this purpose, the support bracket 56 is fixedly mounted on a second set of upper and lower guide rods 57 at their left-hand ends as viewed in FIG. 9, and the guide rods are slidably mounted at their opposite ends (not shown) in a support member of a suitable X, Y, Z micropositioning system (not shown). Thus, the filter support member 51 and the filter 11 can be manually rough-positioned for a vapor deposition operation, and then fine-positioned for the vapor deposition operation by the X, Y, Z micropositioning system (not shown), in a known manner.

Figure 6:
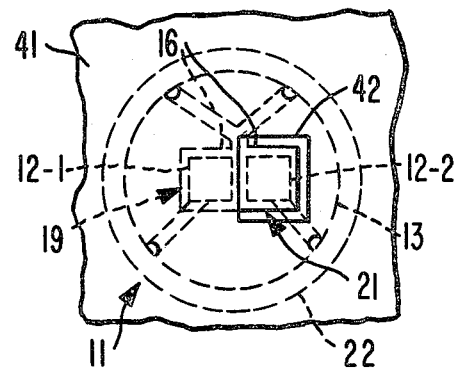
FIG. 6 is a schematic view illustrating a method step for fine-tuning a monolithic crystal filter having the transmission characteristic curve shown in FIG. 3.

The above-mentioned vapor deposition shield 41 in FIGS. 6, 7 and 8, including its associated vapor deposition windows 42 and 43, is shown in the apparatus 46 of FIGS. 9 and 10 as being in the form of a rotatable disc fixedly supported on one end of a support shaft 58 mounted for rotatable and horizontal sliding movement in an upper portion of the support block 47. At its other end the support shaft 58 carries a knurled cap member 59, with a coil spring 61 being disposed between the cap member and the support block 47 to normally urge the disc shield 41 to the left in FIG. 9, against a spacer bushing 62, for a vapor deposition operation. The disc shield 41 also has a locating dowel 63 press-fitted therein which, when the support shaft 58 and the disc shield 41 are moved to the right in FIG. 9 against the action of the coil spring 61, is selectively receivable in one of two locating apertures 64 in the support block 47 to locate one or the other of the vapor deposition windows 42 or 43 in position for a vapor deposition operation. Where the apparatus 46 is to be used for fine-tuning other filters 11 having varying electrode dimensions, additional windows 42 and 43, and additional locating apertures 64, may be provided, as necessary.

A wall portion of the vapor deposition chamber 48 on one side thereof has a cylindrical vapor guide tube 66 mounted therein in a position such that either of the vapor deposition windows 42 or 43 can be positioned in horizontal alignment with the tube, as illustrated by the window 42 in FIG. 9. Another wall portion of the vapor deposition chamber 47 on the opposite side thereof includes an aperture 67 into which a fiber optic light source 68 can be inserted prior to a vapor deposition operation, to project light across the chamber through the vapor guide tube 66 and the vapor deposition window 42 or 43 in alignment with tube, and onto the monolithic crystal filter 11 to be fine-tuned. This projected light on the filter 11 then can be used to align one or the other half of the solid electrode 16 with the window 42, as illustrated in FIGS. 6 and 7, respectively, or to align the solid electrode with the window 43 as illustrated in FIG. 8. The fiber optic light source 68 then is removed from the aperture 67 to avoid plating of material on the light source during the vapor deposition operation, during which a suitable plug (not shown) may be inserted in the aperture if so desired.

Additional electrode material for a vapor deposition operation is provided in a known manner by draping an inverted U-shaped segment of thin (e.g., 20 mils) gold wire 69 in a V-shaped portion of a tungsten filament 71 mounted on the support block 47. The tungsten filament 71 has opposite ends suitably secured to respective electrical terminals 72 mounted in electrically insulating plastic sockets 73 positioned in respective apertures in the support block on opposite sides of the disc shield support shaft 58. The terminals 72 are electrically connected to a power source 74 (shown only in FIG. 9) by leads 76, one of which includes a normally open activating switch 77 (FIG. 9) for causing high current to flow through the tungsten filament 71 and resistance-heat the filament to a high temperature, whereby the filament causes vaporization of the gold wire segment 69 to produce a gold vapor which travels through the vapor guide tube 66 and the vapor deposition window 42 and 43 in alignment therewith, for deposition onto the solid electrode 16 (FIGS. 6-8) of the filter 11.

In use of the apparatus 46 shown in FIGS. 9 and 10, the leads 24 and 28 of the monolithic crystal filter 11 to be fine-tuned are inserted in the terminals 53 in the plastic socket 52 of the filter support slide 51, thus connecting the filter to the circuit shown in FIG. 2 for determining open circuit resonant frequency unbalance of the filter. Assuming that the resultant wave form displayed on the oscilloscope 34 (FIG. 2) then is unbalanced as indicated in FIG. 3 or 4, the disc shield 41 is rotated, if necessary, to align the vapor deposition window 42 with the vapor guide tube 66. The filter support slide 51 then is manually moved in X and Y directions, as necessary, from its retracted position shown in broken lines in FIG. 9, to its advanced position as shown in solid lines in that figure, to rough-position one half or the other half of the filter solid electrode 16 in alignment with the window 42, as illustrated in FIGS. 6 and 7, depending on whether the unbalance in the wave form is as shown in FIG. 3 or FIG. 4, respectively. With the fiber light source 68 inserted in the aperture 67 in the vapor deposition chamber 48, the proper half of the solid electrode 16 then is fine-positioned with respect to the window 42 using the above-mentioned X, Y, Z micropositioning system (not shown), after which the fiber light source is removed from the aperture 67 and the above-mentioned plug (not shown) may be inserted in the aperture for the vapor deposition operation.

A bell jar (not shown) then is positioned on the vacuum device support member 50 over the apparatus 46 and evacuated in a normal manner, thus creating a vacuum in the vapor deposition chamber 48. The activating switch 77 then is closed to begin a vapor deposition operation, whereby the tungsten filament 71 is heated to a high temperature to vaporize the gold wire segment 69 and to deposit gold vapor on the half of the solid electrode 16 in alignment with the vapor deposition window 42. Subsequently, when the peaks $P_A$ and $P_B$ of the wave form on the oscilloscope 34 become balanced, as shown in solid lines in FIG. 5, the activating switch 77 is released to its open position to terminate the deposition operation.

Next, after the above-mentioned bell jar (not shown) has been removed from the vacuum device support member 50, the disc shield 41 is rotated into its position in which the vapor deposition window 43 is in alignment with the vapor guide tube 66. The entire solid electrode 16 then is aligned with respect to the window 43, as shown in FIG. 8, and the apparatus 46 is again subjected to a vacuum environment as above described. The activating switch 77 then is again closed to initiate another vapor deposition operation, to deposit gold vapor on the entire solid electrode 16, until the midband frequency $F_M$ of the filter 11 reaches a desired final value as illustrated by the wave form shown in broken lines in FIG. 5, whereupon the activating switch 77 is again released to its open position to terminate this vapor deposition operation.

In summary, a new and improved method of fine-tuning a monolithic crystal filter, such as the filter 11, has been disclosed in which the filter is fine-tuned without the deposition of any additional electrode material on the split electrodes 12-1 and 12-2, thus eliminating any detrimental change in the resonator coupling frequency $F_B$-$F_A$ of the filter in the fine-tuning operation. In this regard, any unbalance in the open circuit resonant frequencies $F_A$ and $F_B$ of the filter 11 initially is determined utilizing the circuit shown in FIG. 2, and by displaying the resultant resonator coupling frequency wave form on the oscilloscope 34 (FIG. 2) as shown in FIG. 3, 4 or 5. If the peaks $P_A$ and $P_B$ of the wave form are unbalanced, as shown in FIG. 3 or 4, additional electrode material is plated on substantially one half or the other half of the solid electrode 16 as illustrated in FIG. 6 or 7, respectively, until the magnitudes of the peaks of the wave form, and thus the open circuit resonant frequencies of the filter 11, are balanced as shown in FIG. 5. Additional electrode material then is plated on the entire solid electrode 16, as illustrated in FIG. 8, to fine-adjust the filter 11 to a desired final midband frequency $F_M$ as illustrated by the wave form shown in broken lines in FIG. 5.

What is claimed is:

1. A method of fine-tuning a monolithic crystal filter having a solid electrode on one side of a crystal wafer and a pair of split electrodes on an opposite side of the wafer, to define a pair of resonators, which comprises the steps of plating additional electrode material on a selected portion of the solid electrode to balance open circuit resonant frequencies of the resonators of the filter; and plating additional electrode material on substantially the entire solid electrode to adjust the filter to a desired midband frequency.

2. The method as recited in claim 1, which further comprises the steps of:

short-circuiting one of the split electrodes to an associated portion of the solid electrode to produce a filter resonator coupling frequency wave form having first and second peaks, the positions of which correspond to upper and lower short circuit resonant frequencies of the resonators of the filter, respectively;

displaying the resonator coupling frequency wave form on a screen; and balancing the open circuit resonator resonant frequencies of the filter by plating additional electrode material on the selected portion of the solid electrode to balance the peaks of the wave form.

3. The method as recited in claim 2, in which:

the selected portion of the solid electrode upon which additional electrode material is plated is on a half of the solid electrode which, in conjunction with an associated one of the split electrodes, defines the resonator having the wave form peak of least magnitude and having the highest open circuit resonant frequency.

4. The method as recited in claim 2, in which:

the selected portion of the solid electrode on which the additional electrode material is plated is essentially one-half of the solid electrode.

5. The method as recited in claim 4, in which:

the one-half of the solid electrode on which the additional electrode material is plated is that half of the solid electrode which, in conjunction with an associated one of the split electrodes, defines the resonator having the wave form peak of least magnitude and having the highest open circuit resonant frequency.

* * * * *

UNITED STATES PATENT AND TRADEMARK OFFICE
CERTIFICATE OF CORRECTION

PATENT NO. : 4,343,827
DATED : August 10, 1982
INVENTOR(S) : Edwin C. Thompson

It is certified that error appears in the above-identified patent and that said Letters Patent are hereby corrected as shown below:

In the specification, Column 1, line 8, "finetuning" should read --fine-tuning--. Column 3, line 52, after "illustrated" insert --by the wave form shown--. Column 3, line 54, after "illustrated" insert --by the wave form shown--. Column 5, line 68, second occurrence, "and" should read --or--. Column 6, line 56, after "value" insert --$F_{MF}$--. Column 7, line 14, "FM" should read --$F_{MF}$--.

Signed and Sealed this

Eighteenth Day of October 1983

[SEAL]

Attest:

GERALD J. MOSSINGHOFF

Attesting Officer

Commissioner of Patents and Trademarks